(12) United States Patent
Blumenthal

(10) Patent No.: US 9,642,277 B2
(45) Date of Patent: May 2, 2017

(54) MOTOR VEHICLE DOOR LOCK HOUSING

(75) Inventor: Frank Blumenthal, Kempen (DE)

(73) Assignee: Kiekert Aktiengesellschaft, Heiligenhaus (DE)

( * ) Notice: Subject to any disclaimer, the term of this patent is extended or adjusted under 35 U.S.C. 154(b) by 101 days.

(21) Appl. No.: 14/110,892

(22) PCT Filed: Mar. 24, 2012

(86) PCT No.: PCT/DE2012/000318
§ 371 (c)(1),
(2), (4) Date: Apr. 2, 2014

(87) PCT Pub. No.: WO2012/139545
PCT Pub. Date: Oct. 18, 2012

(65) Prior Publication Data
US 2014/0216810 A1  Aug. 7, 2014

(30) Foreign Application Priority Data

Apr. 9, 2011  (DE) .................... 20 2011 005 085 U

(51) Int. Cl.
| | | |
|---|---|---|
| H01L 23/48 | (2006.01) | |
| H05K 7/14 | (2006.01) | |
| H05K 1/14 | (2006.01) | |
| H05K 1/18 | (2006.01) | |
| H01R 9/00 | (2006.01) | |
| E05B 85/02 | (2014.01) | |
| E05B 81/54 | (2014.01) | |
| E05B 63/00 | (2006.01) | |

(52) U.S. Cl.
CPC ........... *H05K 7/1427* (2013.01); *E05B 81/54* (2013.01); *E05B 85/02* (2013.01); *E05B 63/0056* (2013.01)

(58) Field of Classification Search
CPC ...... H05K 7/14; H05K 7/1427; H05K 5/0069; H05K 5/064; H05K 2201/0394; H05K 9/0037; H05K 2201/0999; E05B 85/02
USPC ......... 174/533, 535; 361/736, 762, 772, 793
See application file for complete search history.

(56) References Cited

U.S. PATENT DOCUMENTS

| | | | | |
|---|---|---|---|---|
| 3,372,455 A | * | 3/1968 | Howie ............... | H05K 13/0053 29/701 |
| 3,562,592 A | * | 2/1971 | Cooke ................ | H01C 17/06 361/736 |
| 3,876,926 A | * | 4/1975 | Schott ................ | H02J 7/248 174/521 |
| 4,218,724 A | * | 8/1980 | Kaufman ........... | H05K 5/0091 361/709 |

(Continued)

FOREIGN PATENT DOCUMENTS

| | | |
|---|---|---|
| DE | 203 07 111 U1 | 9/2004 |
| DE | 10 2009 042 630 A1 | 3/2011 |
| WO | 2010136004 A1 | 12/2010 |

*Primary Examiner* — Chau N Nguyen
*Assistant Examiner* — Roshn Varghese
(74) *Attorney, Agent, or Firm* — Renner, Otto, Boisselle & Sklar, LLP

(57) ABSTRACT

A motor vehicle door lock housing comprising at least one outwardly facing recess (2) for receiving electric strip conductors (3) and with passages (4) in the recess (2) for connecting the strip conductors (3) to the housing interior, wherein the strip conductors (3) together with at least one strip conductor board (6) carrying the latter can be placed in the recess (2).

9 Claims, 2 Drawing Sheets

(56) References Cited

U.S. PATENT DOCUMENTS

| | | | | |
|---|---|---|---|---|
| 4,879,630 A * | 11/1989 | Boucard | ............ | H01L 23/49575 174/16.3 |
| 5,408,383 A * | 4/1995 | Nagasaka | ............ | H01L 21/4842 361/772 |
| 5,480,309 A | 1/1996 | Arisaka | | |
| 5,519,252 A * | 5/1996 | Soyano | ................... | H01L 21/56 361/728 |
| 5,521,437 A * | 5/1996 | Oshima | ................... | H01L 23/24 257/687 |
| 5,737,188 A * | 4/1998 | Flierl | ................. | B60R 16/0239 361/715 |
| 5,747,876 A * | 5/1998 | Majumdar | .............. | H01L 23/24 257/687 |
| 5,827,999 A * | 10/1998 | McMillan | ............... | H01L 23/04 361/718 |
| 5,877,944 A * | 3/1999 | Onizuka | ................ | H01H 85/20 361/644 |
| 6,384,332 B1 * | 5/2002 | Skrzypchak | ............ | H01L 21/56 361/752 |
| 6,430,054 B1 * | 8/2002 | Iwata | .................... | H05K 7/026 174/560 |
| 6,521,830 B1 * | 2/2003 | Platz | ....................... | B29C 70/72 174/50 |
| 8,576,047 B2 * | 11/2013 | Peschl | .................... | E05B 81/76 340/5.2 |
| 8,801,245 B2 * | 8/2014 | De Wind | ...................... | 362/511 |
| 2002/0109264 A1 * | 8/2002 | Lechner | ............... | H05K 3/0058 264/272.11 |
| 2003/0178217 A1 * | 9/2003 | Wang | .................. | B23K 1/0008 174/535 |
| 2005/0198819 A1 | 9/2005 | Hunkeler | | |
| 2009/0277682 A1 * | 11/2009 | Bungo | ................... | H05K 3/284 174/521 |
| 2009/0296356 A1 | 12/2009 | Ito | | |

\* cited by examiner

MOTOR VEHICLE DOOR LOCK HOUSING

CROSS REFERENCE TO RELATED APPLICATIONS

This application claims priority under 35 U.S.C. 119 and 35 U.S.C. 365 based upon German Patent Application No. 20 2011 005 085.8, filed on Apr. 9, 2011. The entire disclosure of the aforesaid application is incorporated herein by reference.

FIELD OF THE INVENTION

Then invention relates to a motor vehicle door lock housing with at least one outwardly facing recess for receiving electric strip conductors, and with passages in the recess for connecting the strip conductors to the housing interior.

BACKGROUND OF THE INVENTION

Such motor vehicle door lock housings generally consist of several parts and typically comprise a metal lock case and an actual plastic lock housing or a plastic cover or a plastic housing body. Said recess is located in the actual plastic lock housing. The recess faces outwards and can thus receive one or several strip conductors from the outside. As a result, the basic motor vehicle door lock and the motor vehicle door lock housing can be produced after which the strip conductors are arranged in the recess only at the end. The recess is sealed with a sealing compound in order to protect the strip conductors against corrosion or environmental influences.

The generic state of the art of WO 2010/136004 A1 discloses that the strip conductors are placed as printed or stamped conductor screens in the recess and are connected to electric/electronic components located in the housing interior. This arrangement has generally proven to be successful but could be improved as regards the required assembly and production, as nowadays, manufacturers often use standardised components, which require, for instance, for different strip conductors or strip conductor structures to be accommodated in the motor vehicle door lock housing. Prior art arrangements have so far not produced any convincing solutions in this respect.

SUMMARY OF THE INVENTION

The invention is based on the technical problem of further developing such a motor vehicle door lock housing in such a way that it can be universally used and that assembly/manufacture is simplified.

To solve this technical problem, a generic motor vehicle door lock housing as part of the invention is characterized in that the strip conductors with at least one strip conductor board, on which they re arranged, can be positioned in the recess.

As part of the invention, the strip conductors are thus expressly not positioned in the recess as printed or stamped conductor screens according to WO 2010/136004 A1. Instead, the invention uses a strip conductor board carrying the strip conductors. This strip conductor board generally contains feet on the housing side. It has proven to be advantageous for the feet to be designed as strip conductor extensions. The feet or the strip conductor extensions of the strip conductor board engage in each case in individual passages in the recess. As a result, the strip conductor board is centred inside the recess and the feet designed as strip conductor extensions also ensure that the strip conductors carried by the strip conductor board can assume the desired electrical connection with the electric/electronic components provided in the housing interior.

The chosen design may consequently such that the feet on the housing side of the strip conductor board engage in respective plug receptacles in the housing interior. Said plug receptacles can be mechanical plug receptacles, if the feet on the housing side are non-conductive. Generally, the feet on the housing side are, however, strip conductor extensions extending mainly at right angles from the underside of the strip conductor board. In this case, the plug receptacles are electrical plug receptacles, i.e. those that provide a direct electric contact as soon as the feet designed as strip conductor extensions engage in said electric plug receptacles. Individual electric/electronic components in the housing interior of the motor vehicle door lock housing can be connected to the electric plug receptacles.

Typically the inside of a motor vehicle door lock housing contains one or several electric motors, individual sensors, micro switches, etc., required for the operation of the motor vehicle door lock or that monitor individual functional positions of the motor vehicle door lock.

The strip conductor board can generally be any type of strip conductor board, i.e. a printed board with single or multiple layer, typically produced from an insulation material. The strip conductors are defined on such a strip conductor board by chemical and or physical processes. Also, the top of the strip conductor board, i.e. the upper side facing the housing feet on the bottom, can contain electric/electronic components. In particular electronic SMD components (surface-mounted device) have proven to be advantageous. This is naturally only an example and not mandatory.

The strip conductor board with its feet on the housing side protruding from its base, is normally applied to one or several supports of the recess. The recess consequently contains one or several supports for the strip conductor board. The one or several supports are typically a continuous frame. Alternatively or in addition, the support or the frame can also be designed as a seal.

Such an embodiment has shown to be particularly advantageous where the strip conductor board closes off the recess in the manner of a cover. In this case, the plane internal cross section of the recess and the plane extension of the strip conductor board are typically adapted to each other in such a way that the strip conductor board can be positively accommodated in the recess, on which one or several supports rest, as a result of which the recess is closed off in the manner of a cover. The casting compound subsequently applied to the strip conductor board or filled into the recess can consequently easily seal the recess. In most cases, the casting compound will be mainly arranged between a surface or top side of the strip conductor board and the edge at the head of the recess. As regards application of the casting compound, only a thin layer of casting compound is, on the other hand, applied to the area from the bottom surface or base of the strip conductor board up to the base of the recess. In this way the quantity of casting compound for each recess to be sealed can be considerably reduced compared to previous embodiments. The described design is therefore particularly cost effective.

Also, the strip conductor board including the strip conductors and any additionally installed electric/electronic components defines or can define a pre-assembled subassembly. Ideally, the motor vehicle door lock including all levers, assemblies, etc. to be arranged in the housing interior is fully assembled and enclosed by the motor vehicle door lock housing of the invention. The electric/electronic components arranged inside the motor vehicle door lock housing are then controlled and electrically connected by the strip conductor board or the already preassembled subassembly being inserted in the recess. During the process the thus provided strip conductor board or strip conductor board with the strip conductors arranged thereon or possible electric/electronic components, uses the one or several supports inside the recess for positioning.

This ensures that the feet or strip conductor extensions can extend directly through the associated passages in the recess and engage on the other side of the passages and in the housing interior in the provided plug receptacles. This means that the positioning of the preassembled subassembly or of the printed circuit board or strip conductor board in the recess also ensures that the strip conductors on the strip conductor board are electrically connected with the associated and desired assemblies in the housing interior. No other work is required. As soon as the preassembled subassembly or the strip conductor board is positioned in the recess, the recess and the strip conductor board can be sealed by said casting compound.

In other words, no complicated installation work is required and instead, the pre-installed subassembly or strip conductor board only has to be placed in the recess with this process also providing the required electric contact. To complete the process, the strip conductor board is sealed in the recess, so that the motor vehicle door lock housing of the invention is directly ready for use and prepared for installation. These are the main advantages.

In another advantageous embodiment, the support for the strip conductor board or the pre-installed subassembly is provided at an edge of the recess. It has also shown too be particularly advantageous if the height of the support in question in connection with, where applicable, the height of the equipped and supported strip conductor board is equal to or thinner than the depth of the recess. This ensures that the strip conductor board resting on the support or any components on said board do not exceed the edge on the head of the recess or do not "protrude". The casting compound applied after assembly of the strip conductor board then ensures that the strip conductor board is completely or nearly completely covered by the casting compound or that no components protruding over the edge on the head of the recess are visible.

Of further significance is the fact that the passages in the recess describe a hole pattern adapted to the strip conductor board inserted in the recess. In other words, each strip conductor board inserted in the recess corresponds to a special hole pattern of the passages in the recess. In order to achieve a particular standardized manufacture and to allow, where possible, the use of the same door lock housing for different door lock designs, it has further proven to be advantageous for the recess to be designed for receiving different printed circuit boards. It is for instance feasible that the same door lock housing is used to accommodate a motor vehicle door lock with central locking and a motor vehicle door lock without central locking.

Both types, i.e. with and without central locking or with opening and closing assistance naturally require different strip conductor boards, as for instance in the central locking model a central locking motor has to be controlled, the position of a central locking lever has to be sensed, etc. Naturally, none of these described functions are required for a motor vehicle door lock without central locking functions. Consequently, the respective strip conductor board for the central locking model tends to have considerably more feet on the housing side to provide the contact for subassemblies contained in the housing interior compared to models without central locking.

In order to, however, be able to accommodate both models of the example in the recess or in the same motor vehicle door lock housing, all strip conductor board hole patterns correspond to a universal hole pattern of the passages in the recess. This means that the strip conductor board placed in the recess defines its own strip conductor board hole pattern or a pattern of the feet on the housing side on the strip conductor board. All strip conductor boards placeable in the recess and the respective strip conductor board hole patterns thus define a universal hole pattern, typically implemented in the recess.

This universal hole pattern is characterized in that in general feet on the housing side of the strip conductor board inserted in the recess do not extend through all openings or passages. Instead more or fewer passages remain uncovered during this process. Only when inside of the motor vehicle door lock housing contains a lock, fulfilling all conceivable functions, also all passages of the universal hole pattern are "occupied" by the associated feet on the housing side.

In this way, manufacture and assembly is simplified even more as different types of the motor vehicle door lock can be accommodated in the same motor vehicle door lock housing. This also applies to the strip conductor board belonging to the respective motor vehicle door lock, as the outwardly facing recess, accommodating the strip conductor board, is universally designed for receiving the respective strip conductor board. This simplifies positioning and also assembly is significantly easier than before. At the same time resources are saved as the required quantity of casting compound is significantly reduced compared to prior art embodiments.

BRIEF DESCRIPTION OF THE DRAWINGS

Below, the invention is described in more detail with reference to exemplary drawings showing only one embodiment, as follows.

Other features and advantages of the present invention will become apparent from the following detailed description, taken in conjunction with the accompanying drawings which illustrate, by way of example, the principles of the invention.

DETAILED DESCRIPTION OF THE INVENTION

Figure 1:
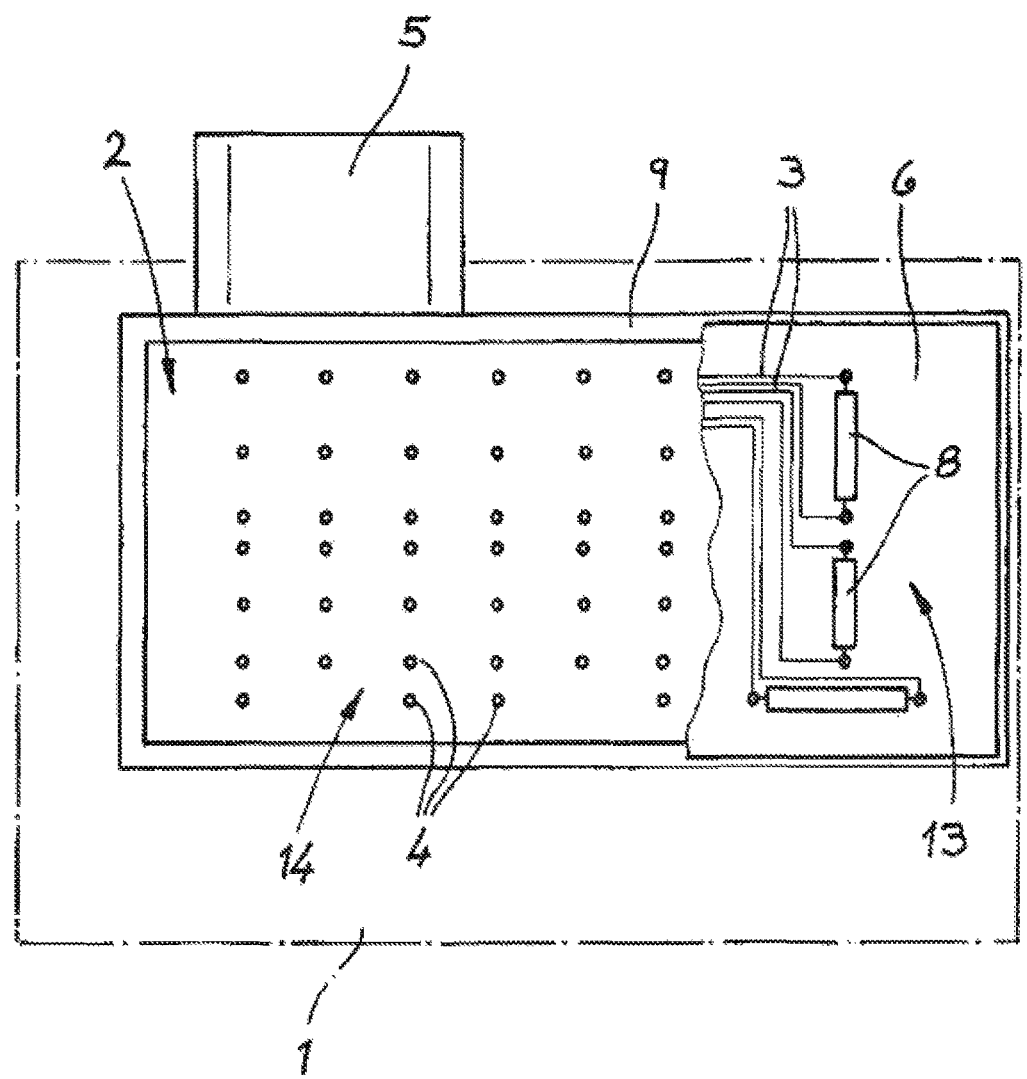
FIG. 1 shows a schematic overview of the motor vehicle door lock housing according to the invention.

FIG. 1 shows a motor vehicle door lock housing containing first of all a housing body 1 made of plastic. Apart from this plastic housing body 1 a metal lock case is typically provided. This is, however, not shown. Together, the metal lock case and the plastic housing body 1 make up the motor vehicle door lock housing. Of special significance for the below observations is an outwardly facing recess 2 on this motor vehicle door lock housing. The recess 2 serves to receive electric strip conductors 3. Also, passages 4 are provided in the in the recess 2. The strip conductors 3 are connected to the housing interior by means of the passages 4 in the recess 2. This is schematically shown in the sectional view of FIG. 2. The housing interior contains motors, sensors, plug-in contacts, etc. connected via the strip conductors 3. For this purpose, the strip conductors 3 produce an electric connection to a socket 5 in the example. A plug, not shown, can be connected to the socket 5, which in turn ensures the electric connection of the shown motor vehicle door lock to, for instance, a control unit inside a motor vehicle.

In this embodiment and according to a preferred embodiment of the invention, the strip conductors 3 together with the strip conductor board 6 accommodating the strip conductors 3, is placed in the recess. This means that in the embodiment, strip conductors 3 are arranged on the strip conductor board 6, as electrically conductive conductors that are, for instance, printed or applied by any other process onto the strip conductor board 6. The strip conductor board 6 is also provided with feet 7 on the housing side, providing an electric connection to the individual strip conductors 3. The feet 7 on the housing side extend more or less vertically from a base U of the strip conductor board 6, as clearly shown in the cross sectional view of FIG. 2. The top O of the strip conductor board 6 can contain electric/electronic parts 8. The so-called SMD technology has proven to be particularly advantageous in this respect.

In this way, the strip conductor board 6 including the electric/electronic components 8 and the feet 7 on the housing side can be produced together as a preassembled subassembly 6, 7, 8. This preassembled subassembly 6, 7, 8 can be positioned in the recess 2. For this purpose, the recess 2 contains one or several supports 9 also best apparent from the sectional view of FIG. 2. The support 9 in the example is indeed a frame 9, provided at an edge of the recess 2.

Figure 2:
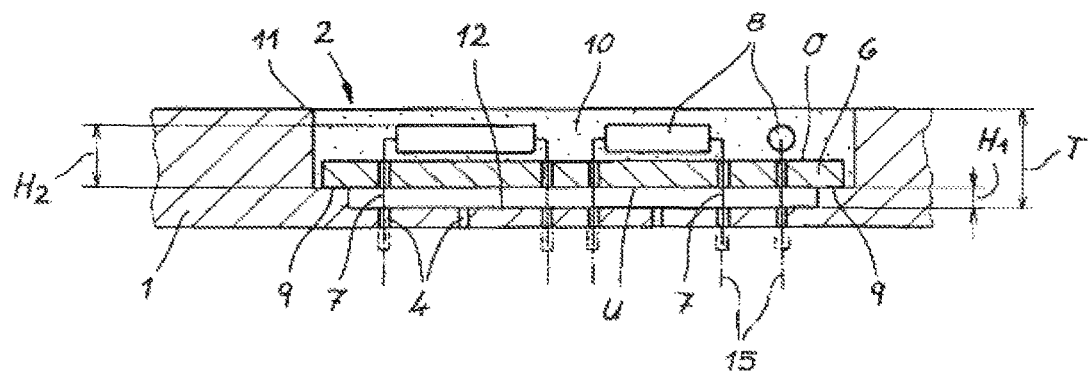
FIG. 2 shows a cross section of the object of FIG. 1.

For this purpose, the support 9 has, as shown in FIG. 2, a height $H_1$, which together with a height $H_2$ of the strip conductor board 6 and its components resting on the support 9 or the height $H_2$ of the subassembly 6, 7, 8 corresponds to a depth T of the recess 2 or is smaller than said depth. According to the invention, the following relation does thus apply:

$$H1+H2S \leq T.$$

As, furthermore, the area of the strip conductor board 6 matches the area of the recess 2 or the strip conductor board 6 sits predominantly flush in the recess 2, this explains that the strip conductor board 6 seals the recess 2 like a cover, as soon as it rests on the supports 9. Indeed it is ensured in this way that the casting compound 10 is mainly located between the surface or top O of the strip conductor board 6 and an edge 11 on the head of the recess 2. In contrast, an area between the base U of the strip conductor board 6 and a base 12 of the recess 2 only contains a thin layer of casting compound 10.

The recess 2 is arranged on the plastic housing body 1 and typically forms a single plastic piece with the housing body 1 and is moulded in the body. The same applies to the supports 9 or the edge 9.

The recess 2 or the housing body 1 made of plastic are consistently retained even if different embodiments of the respective implemented door lock are positioned in the interior of the housing. It is for instance feasible that the same motor vehicle door lock housing is used to accommodate a motor vehicle door lock with central locking or a motor vehicle door lock without central locking in its interior.

As, in addition, the openings or passages 4 in the recess 2 describe a hole pattern 13 adapted in each case to a strip conductor board 6 inserted in the recess 2, it is clear that depending on the level of equipment of the door lock (with or without central locking) also different preassembled subassemblies (6, 7, 8) are used. These different preassembled subassemblies 6, 7, 8 correspond to adapted and varied hole patterns 13. This means that the recess 2 is designed for receiving different strip conductor boards 6 or different preassembled subassemblies 6, 7, 8.

The individual corresponding hole patterns 13 are now part of the associated preassembled subassembly 6, 7, 8 or the associated strip conductor board 6. This results in a strip conductor board hole pattern 13, ultimately defined by the arrangement of the feet 7 on the housing side, extending (having to extend) through the associated passages 4.

All different strip conductor board hole patterns 13 now define a universal hole pattern 14 of the passages 4 in the recess 2. This universal hole pattern 14 is arranged and designed in such a way, that any conceivable type of the motor vehicle door lock accommodated inside of the motor vehicle door lock housing can be accommodated, with each respective type being associated with a preassembled subassembly 6, 7, 8. This arrangement is made possible as the recess 2 is sealed by the strip conductor board 6 or the preassembled subassembly 6, 7, 8 in the manner of a cover and by the casting compound 10 basically being predominantly arranged between the surface or top O of the strip conductor board 6 and the edge 11 at the head of the recess 2. It is virtually impossible for casting compound 10 to enter unassigned passages 4 and thus the inside of the housing.

As soon as the preassembled subassembly 6, 7, 8 or the strip conductor board 6 is positioned in the recess 2 on the frame 9, the feet 7 on the housing side engage in the plug receptacles 15 in the housing interior. During this process, the feet 7 on the housing side extend through individual or all passages 4 in the recess 2. In the embodiment, the plug receptacles 15 are designed as electrical plug receptacles 15 and are connected to the assemblies inside the housing by means of conductors. In this way, the subassembly 6, 7, 8 positioned inside the recess 2 directly provides the required electrical connection from the bushing 5 through the strip conductors 3 up to the assemblies in the housing interior to be controlled or scanned.

It is to be understood that the above-described embodiment is illustrative of only one of the many possible specific embodiments which can represent applications of the principles of the invention. Numerous and varied other arrangements can be readily devised by those skilled in the art without departing from the spirit and scope of the invention.

What is claimed is:

1. A motor vehicle door lock housing comprising: at least one outwardly facing recess, electric strip conductors that are arranged on a strip connector board, and the housing having passages in the recess for connecting the strip conductors to an interior of a housing, the passages extending through the housing from a base of the recess on which the strip connector board rests to an external surface of the housing, and wherein:

the strip conductors together with the strip conductor board are received in the recess, electric/electronic components are mounted on an upper surface of the strip conductor board that is opposite to a bottom of the recess, the strip conductor board and the electric/electronic components are embedded in a casting compound in the recess, the strip conductor board contains feet that extend through the passages on a housing side, the passages through the housing define a universal hole pattern in which the passages can accommodate different patterns of feet in which a number of feet differs from the number of passages, the recess contains a support for the strip conductor board, the support is designed as a continuous frame and is provided on an edge of the recess, and the recess is sealed by the strip conductor board in the manner of a cover to form a space between a bottom surface of the strip conductor board and the base of the recess, and the casting compound is predominantly arranged between a surface or top of the strip conductor board and an edge at a head of the recess, the casting compound being located inside the housing and not extending into passages that do not contain feet.

2. The motor vehicle door lock housing according to claim 1, wherein the feet on the housing side are designed as strip conductor extensions and each extend through the passages individually.

3. The motor vehicle door lock housing according to claim 1, wherein the feet on the housing side engage in plug receptacles in the interior of the housing.

4. The motor vehicle door lock housing according to claim 1, wherein the support is of a height, which together with the height of the strip conductor board having the electric/electronic components corresponds to or is smaller than a depth of the recess.

5. The motor vehicle door lock housing according to claim 1, wherein the strip conductor board including the strip conductors and the electric/electronic components defines a preassembled subassembly.

6. The motor vehicle door lock housing according to claim 1, wherein the recess is designed for receiving different strip conductor boards.

7. The motor vehicle door lock housing according to claim 1, wherein the strip conductor board insertable in the recess corresponds to its own strip conductor board hole patterns.

8. The motor vehicle door lock housing according to claim 7, wherein all of the strip conductor board hole patterns correspond to a universal hole pattern in the recess.

9. The motor vehicle door lock housing according to claim 1, wherein an upper surface of the casting compound is flush with an upper surface of the housing.

\* \* \* \* \*